United States Patent
Nakajima et al.

(10) Patent No.: US 7,457,100 B2
(45) Date of Patent: Nov. 25, 2008

(54) CAPACITOR DEVICE AND WIRING PATTERN

(75) Inventors: Norio Nakajima, Kyoto (JP); Kouji Moriyama, Uji (JP); Yoshihiro Watanabe, Osaka (JP)

(73) Assignee: Panasonic Corporation, Osaka (JP)

( * ) Notice: Subject to any disclaimer, the term of this patent is extended or adjusted under 35 U.S.C. 154(b) by 338 days.

(21) Appl. No.: 10/568,678

(22) PCT Filed: Sep. 1, 2004

(86) PCT No.: PCT/JP2004/013010

§ 371 (c)(1),
(2), (4) Date: Feb. 17, 2006

(87) PCT Pub. No.: WO2005/025029

PCT Pub. Date: Mar. 17, 2005

(65) Prior Publication Data

US 2006/0279257 A1    Dec. 14, 2006

(30) Foreign Application Priority Data

Sep. 3, 2003    (JP)    ............................ 2003-311498

(51) Int. Cl.
  *H01G 4/38* (2006.01)
(52) U.S. Cl. .................. 361/328; 361/330; 361/306.2; 361/303; 361/763; 361/765
(58) Field of Classification Search ......... 361/328–330, 361/306.1, 306.3, 311–313, 302–305, 763, 361/765
See application file for complete search history.

(56) References Cited

U.S. PATENT DOCUMENTS

| 3,997,830 | A |   | 12/1976 | Newell et al. |
| 4,313,084 | A |   | 1/1982 | Hosokawa et al. |
| 4,853,833 | A |   | 8/1989 | Fiorina et al. |
| 5,495,387 | A | * | 2/1996 | Mandai et al. ............... 361/328 |
| 5,528,121 | A |   | 6/1996 | Okamura |
| 5,982,050 | A |   | 11/1999 | Matsui |
| 6,285,542 | B1 | * | 9/2001 | Kennedy, III et al. ....... 361/328 |
| 6,856,516 | B2 | * | 2/2005 | Ernsberger et al. .......... 361/763 |

FOREIGN PATENT DOCUMENTS

| EP | 0 795 947 | 9/1997 |
| JP | 5-23527 | 3/1993 |
| JP | 6-276675 | 9/1994 |
| JP | 6-343225 | 12/1994 |
| JP | 9-308121 | 11/1997 |

OTHER PUBLICATIONS

Supplementary European Search Report issued Mar. 6, 2008 in the Application No. EP 04 77 2882.

* cited by examiner

*Primary Examiner*—Nguyen T Ha
(74) *Attorney, Agent, or Firm*—Wenderoth, Lind & Ponack, L.L.P.

(57) ABSTRACT

A capacitor device is provided which includes a plurality of electric double-layer capacitors connected in series, and a balance resistor portion where five resistors having an equivalent resistance are connected in parallel. In this capacitor device, the balance resistor portion is connected to each electric double-layer capacitor, so that the electric double-layer capacitors connected in series can be charged uniformly.

9 Claims, 6 Drawing Sheets

CAPACITOR DEVICE AND WIRING PATTERN

TECHNICAL FIELD

The present invention is the art of a capacitor device in which electric double-layer capacitors are used.

BACKGROUND ART

In recent years, a capacitor device where an electric double-layer capacitor is used has been promised as a mechanical-power source for an electric automobile or the like. In such an electric double-layer capacitor, as its electrode, an active carbon is used which has a large specific surface area and is electrochemically inactive. This electrode is immersed in an electrolyte, and an electric charge is generated on the interface between the electrode and the electrolyte. Then, this electric charge is stored in the electric double layer so that it can be used in the capacitor.

An electric double-layer capacitor has a low withstand voltage (i.e., a rated voltage) of two to three volts. Hence, a capacitor device is generally configured by several electric double-layer capacitors. Besides, in an electric double-layer capacitor, the capacitance, internal resistance or the like of each element is known to vary widely. Therefore, if a capacitor device is formed by several electric double-layer capacitors, some of such devices can be fully charged soon while some may take a long time to charge. Hence, there is a disadvantage in that each electric double-layer capacitor cannot be charged in balance.

As the art of resolving this disadvantage, a "balance circuit system" is known. FIG. 6 is a circuit diagram, showing a circuit which embodies a "balance circuit system". The circuit shown in FIG. 6 is made up of n (which is a positive number) electric double-layer capacitors C101 to C10$n$ which are connected in series, and n balance resistors R101 to R10$n$. The balance resistors R101 to R10$n$ each have an equivalent resistance and are connected in parallel to the electric double-layer capacitors C101 to C10$n$. Thereby, a bias voltage applied to each electric double-layer capacitor C101 to C10$n$ is equal, thus helping charge each electric double-layer capacitor in a well-balanced state.

Furthermore, in another circuit (refer to Japanese Utility Model Laid-Open No. 5-23527 specification) which realizes a "balance circuit system", a balance resistor is electrically separated from an electric double-layer capacitor at a non-charge time. When the voltage between both ends of this capacitor becomes a predetermined value or above, the capacitor is connected in parallel to the balance resistor. This prevents an electric discharge at a non-charge time, thus helping store electrical energy for a long time.

Moreover, still another circuit (refer to Japanese Patent Laid-Open No. 6-343225 specification) which embodies a "balance circuit system" includes a comparison circuit which compares the voltage between both ends of an electric double-layer capacitor and a charging reference voltage, and a by-pass circuit which receives an output from the comparison circuit and by-passes a charging current for the electric double-layer capacitor. The height of the charging reference voltage is changed suitably for various uses, so that the bias voltage of the electric double-layer capacitor can be regulated.

DISCLOSURE OF THE INVENTION

However, any of the inventions described in the circuit shown in FIG. 6, Japanese Utility Model Laid-Open No. 5-23527 specification and Japanese Patent Laid-Open No. 6-343225 specification has the following disadvantages. A single balance resistor is connected in parallel to an electric double-layer capacitor. Therefore, the dispersion of the resistance of such a balance resistor makes it impossible to charge electric double-layer capacitors uniformly.

Furthermore, if a balance resistor is broken and opened, the bias voltage given to an electric double-layer capacitor rises largely. Thus, the bias voltage applied to each electric double-layer capacitor is thrown out of balance. This presents a disadvantage in that each electric double-layer capacitor cannot be charged in balance. Moreover, another disadvantage also arises in that the bias voltage may exceed the rated voltage of an electric double-layer capacitor, thereby destroying the electric double-layer capacitor.

It is an object of the present invention to provide a capacitor device which is capable of charging electric double-layer capacitors in balance and preventing the electric double-layer capacitors from being damaged.

A capacitor device according to the present invention, characterized by including: a plurality of electric double-layer capacitors which are connected in series; and a balance resistor portion in which m (which is an integer of two or above) resistors having an equivalent resistance are connected in parallel, the balance resistor portion being connected in parallel to each electric double-layer capacitor.

According to this configuration, to each of several electric double-layer capacitors connected in series, a balance resistor portion in which m (which is an integer of two or above) resistors having an equivalent resistance are connected in parallel is connected in parallel. Therefore, the resistance of the balance resistor portion can be restrained from varying widely. This helps charge each electric double-layer capacitor uniformly. Further, even if a part of the resistors which form the balance resistor portion is broken to turn into an open state, then because there are the other resistors connected in parallel, the bias voltage given to the electric double-layer capacitor is kept from being higher. This helps prevent the electric double-layer capacitor from being destroyed. Consequently, the capacitor device becomes more reliable, thus preventing the whole of an apparatus to which the capacitor device is connected from malfunctioning. Still further, even if any resistor is damaged, the bias voltage applied to each electric double-layer capacitor is kept in balance. This allows the capacitor device to function normally.

In addition, preferably, the resistance of the balance resistor portion should be equal to, or less than, one-fourth the resistance of each resistor which forms the balance resistor portion.

According to this configuration, the resistance of the balance resistor portion is equal to, or less than, one-fourth the resistance of each resistor which makes up the balance resistor portion. In other words, the number of the resistors which make up the balance resistor portion is four or above. Therefore, even if any one of the resistors which make up the balance resistor portion is broken and opened, the resistance of the balance resistor portion can be restrained from going up beyond 25 percent. This contributes toward keeping the rise in the bias voltage at 25 percent or under. Hence, if the value of the bias voltage is set at 25 percent or less of the rated voltage of the electric double-layer capacitor, the value of the bias voltage is more unlikely to exceed the rated voltage, though any resistors are damaged and opened. This helps lengthen the life span of the electric double-layer capacitor.

Furthermore, it is preferable that the resistance of the balance resistor portion be equal to, or more than, one-sixth, and the resistance of each resistor which forms the balance resistor portion.

According to this configuration, the resistance of the balance resistor portion is equal to, or more than, one-sixth the resistance of the individual resistor. In other words, the number of the resistors of the balance resistor portion is six or below. Therefore, a restraint can be placed on the rise in the bias voltage which may be caused by a broken resistor. At the same time, the power loss which is caused by the increase in the number of resistors can be reduced. Thereby, the electric charge stored in the electric double-layer capacitor can be restrained from being discharged.

Moreover, preferably, the resistance of the balance resistor portion should be equal to, or more than, one-sixth the resistance of each resistor and should be equal to, or less than, one-fourth this resistance.

According to this configuration, the lifetime of the electric double-layer capacitor can be extremely lengthened. Simultaneously, the electric charge stored in the electric double-layer capacitor can be restrained from being discharged.

In addition, it is preferable that the resistance of the balance resistor portion be 100Ω or above and 500Ω or below.

According to this configuration, at the time of a charge and a discharge, a loss can be reduced in the electric double-layer capacitor.

Furthermore, preferably, the number of electric double-layer capacitors connected in series should be set so that a bias voltage given to each electric double-layer capacitor is lower than the rated voltage of the electric double-layer capacitor.

According to this configuration, the bias voltage applied to each electric double-layer capacitor is lower than the rated voltage. This helps prevent the electric double-layer capacitor from being destroyed.

Moreover, it is preferable that one or a plurality of electric double-layer capacitors be further connected in parallel to the balance resistor portion.

According to this configuration, one or several electric double-layer capacitors are further connected to the balance resistor portion. In other words, the electric double-layer capacitors are connected in a matrix form, such that the electric double-layer capacitors connected in parallel are connected in series. This makes it possible to offer a capacitor device which has a superior durability and a great capacitance.

A wiring pattern according to the present invention in which a plurality of electric double-layer capacitors are connected in parallel, characterized in that: the wiring pattern includes three or more wiring patterns disposed at a predetermined interval; a plurality of electric double-layer capacitors are connected in parallel between adjacent wiring patterns; and between two adjacent electric double-layer capacitors which are connected between the wiring patterns, a plurality of resistors having an equivalent resistance are connected in parallel to the electric double-layer capacitors.

According to this configuration, three or more wiring patterns are disposed so that their longitudinal directions are parallel. Between adjacent wiring patterns, several electric double-layer capacitors are connected in parallel. Between two adjacent electric double-layer capacitors, several resistors are connected in parallel with the electric double-layer capacitors. Therefore, the full length of the wiring pattern can be shortened. This helps reduce the resistance of wiring, thus enhancing the charge and discharge efficiency of the electric double-layer capacitor.

Besides, between several wiring patterns disposed in parallel, several resistors and several electric double-layer capacitors are electrically connected. Therefore, even when resistors are broken, the bias voltage given to the electric double-layer capacitor can be kept from being higher, because there are the other resistors connected in parallel. This helps prevent the electric double-layer capacitor from being damaged.

In addition, preferably, the resistors should be connected from one wiring surface of the wiring pattern, and the electric double-layer capacitors should be connected from the other wiring surface of the wiring pattern.

According to this configuration, the electric double-layer capacitors are connected to one wiring surface of the wiring pattern, and the resistors are connected to the other wiring surface of the wiring pattern. Therefore, the overall length of the wiring pattern becomes shorter than in the case where both elements of the electric double-layer capacitors and the resistors are connected only from the side of one wiring surface of the wiring pattern. This helps lessen the resistance of wiring, thus enhancing the charging and discharging efficiency of the electric double-layer capacitor.

BEST MODE FOR IMPLEMENTING THE INVENTION

Hereinafter, embodiments of the present invention will be described with reference to the attached drawings.

First Embodiment

Figure 1:
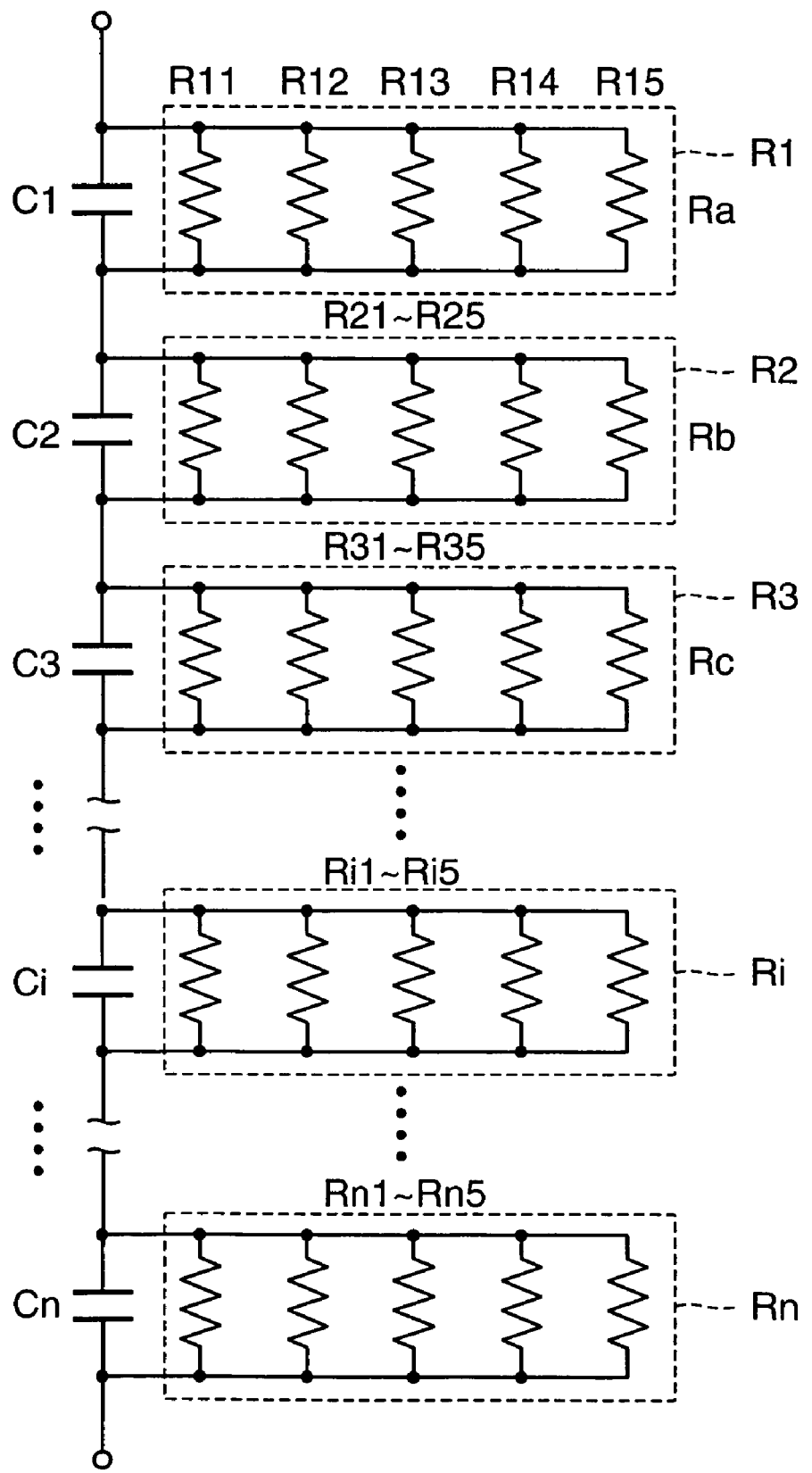
FIG. 1 is a circuit diagram of a capacitor device according to a first embodiment of the present invention.

FIG. 1 is a circuit diagram of a capacitor device according to a first embodiment of the present invention. As shown in FIG. 1, this capacitor device includes n (which is an integer of two or above) electric double-layer capacitors C1 to Cn, and n balance resistor portions R1 to Rn. Hereinafter, the "electric double-layer capacitor" is referred to simply as the "capacitor". The capacitors C1 to Cn are connected in series. The balance resistor portions R1 to Rn are connected in parallel to the capacitors C1 to Cn, respectively.

The balance resistor portions R1 to Rn each have the same configuration, and thus, only the balance resistor portion R1 will be described. The balance resistor portion R1 is provided with five resistors R11 to R15 connected in parallel. The resistors R11 to R15 each have an equivalent resistance. As the resistors R11 to R15, a chip type or a lead-wire type can be used. However, the present invention is not limited especially to this.

The capacitors C1 to Cn each have the same configuration, and thus, only the capacitor C1 will be described. The capacitor C1 is formed in the following way. A drawn-out lead wire is attached to an aluminum foil which is etched at a thickness of 20 to 50 μm. This foil's upper surface is coated with a paste which is made of a mixed powder obtained by mixing an active-carbon powder with a bonding agent and a conductive agent which are desirable. Thereby, a conductive layer is formed. On this conductive layer, active-carbon layer polarization electrodes are formed which include an active carbon as the principal component. Thus, a pair of electric double-layer electrodes is formed. These electric double-layer electrodes are placed to face each other via a separator. Then, they are wound around so that a capacitor element is formed. Sequentially, this capacitor element is impregnated with an electrolyte solution. Then, it is inserted in an aluminum case and its opening part is sealed.

The withstand voltage of the electric double-layer capacitor is determined according to what kind of electrolyte solution it is. Besides, this withstand voltage determines the rated voltage of the electric double-layer capacitor. Ordinarily, the rated voltage of one electric double-layer capacitor is within a range of 2 to 3 V.

Between the capacitors C1 to Cn shown in FIG. 1, a DC voltage V is applied to charge each capacitor. To each capacitor C1 to Cn, the balance resistor portions R1 to Rn which have an equivalent resistance are connected in parallel, respectively. Hence, the bias voltage (V/n) is given which is obtained by dividing the DC voltage V by the number of capacitors.

Herein, as the capacitor Ci which has a rated voltage of 2.6V and a capacitance of 100 F, six capacitors are connected in series. The resistance of resistors Ri1 to Ri5 is 100Ω. To both ends of the capacitors C1 to C6, a DC voltage of 12 V is applied so that the capacitors C1 to C6 can be charged. In this case, because the resistance of resistors R11 to R11 is 100Ω, the resistance of the balance resistor portion R1 is 20Ω which is obtained by dividing 100 by 5.

In this case, the bias voltage of each capacitor C1 to C6 is 2.0 V which is obtained by dividing 12 V by 6. This value is lower than the rated voltage 2.6 V of the capacitors C1 to C6. Thus, the capacitors C1 to C6 can be prevented from being damaged. Therefore, preferably, the number n of capacitors which are connected in series should be n>V/VT, if the DC voltage given to both ends of the capacitors connected in series is V and the rated voltage of each capacitor is VT.

Next, this capacitor device will be compared with a conventional capacitor device, in terms of a change in the bias voltage when a balance resistor is damaged. In a conventional capacitor device including a single balance resistor, if the resistor is broken and opened, the bias voltage given to a capacitor rises largely. This is because no resistors connected in parallel are provided, different from the capacitor device according to this embodiment. Therefore, capacitors connected in series cannot be charged in balance. Besides, the bias voltage may exceed the rated voltage of the capacitor, thus destroying the capacitor.

On the other hand, in the capacitor device according to this embodiment, even if the resistor R11 of the balance resistor portion R1 is broken and turns into an open state, the four resistors R12 to R15 still remain. Therefore, after the resistor R11 is broken, the resistance of the balance resistor portion R1 is kept down to 25Ω/20Ω=1.25 times as great as its resistance before the resistor R11 is broken. Hence, the bias voltage of the capacitor C1 becomes 2.0V×1.25=2.5V, without exceeding the rated voltage 2.6 V of the capacitor C1. This helps prevent the capacitor C1 from being damaged.

Figure 2:
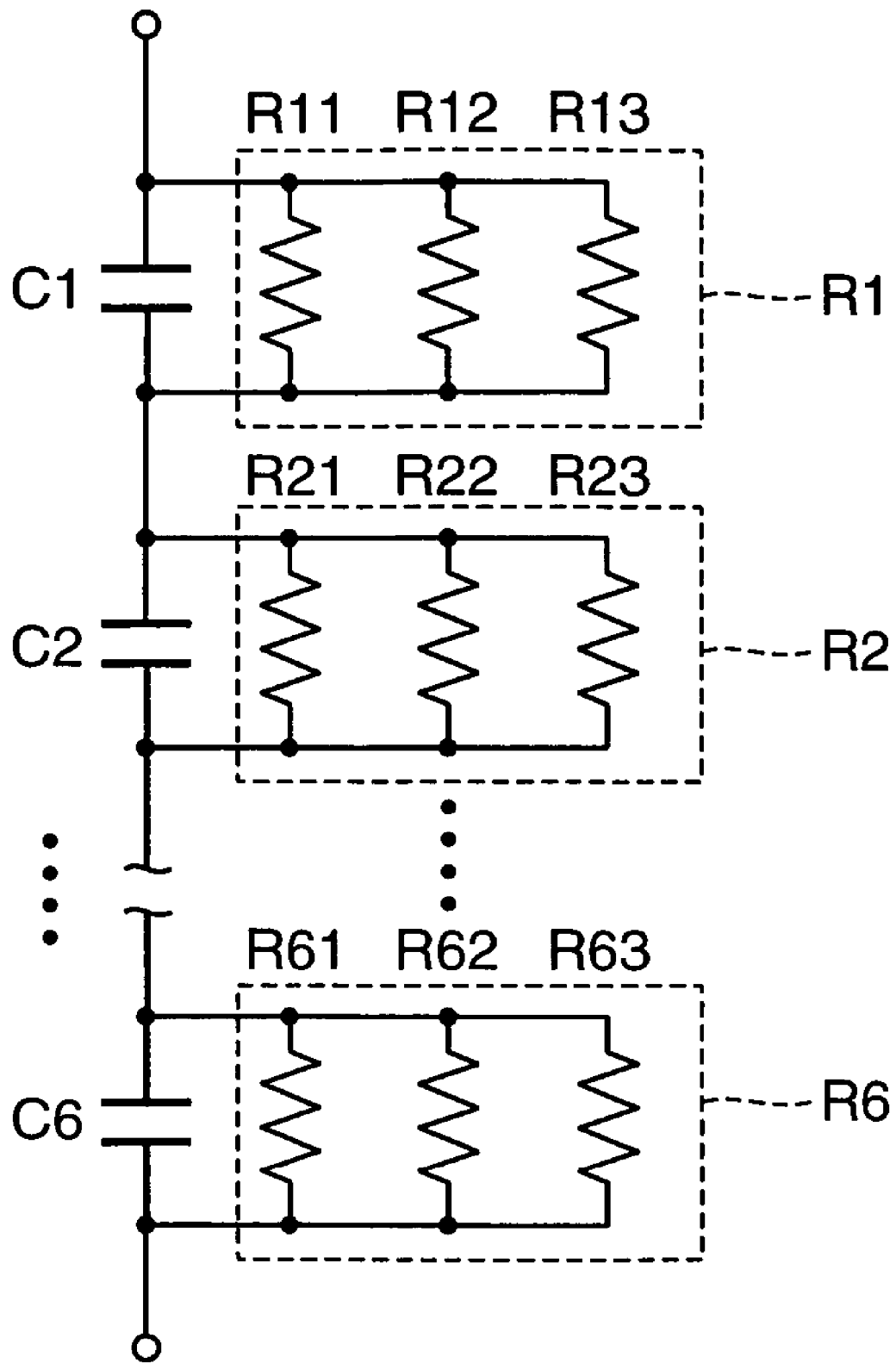
FIG. 2 is a circuit diagram of a capacitor device in which the number of resistors which make up a balance resistor portion is three.

Next, description will be given about, preferably, how many resistors should make up the balance resistor portion Ri. FIG. 2 is a circuit diagram of a capacitor device in which the number of resistors which make up the balance resistor portion R1 is three. The resistance of resistors Ri1 to Ri3 is r. The rated voltage of capacitors C1 to C6 is 2.6 V. To both ends of the capacitors C1 to C6, a voltage of 12 V is applied.

In the capacitor device shown in FIG. 2, let's assume that a resistor R11 is damaged. In this case, a balance resistor portion R1 turns into a circuit in which two resistors R12, R13 are connected in parallel. Thereby, its resistance becomes r/2. On the other hand, before the resistor R11 is damaged, the resistance of the balance resistor portion R1 is r/3. Therefore, after the resistor R11 is damaged, the resistance of the balance resistor portion R1 becomes (r/2)/(r/3)=1.5 times as great as that before it is damaged, 50 percent up. This also causes the bias voltage to rise by 50 percent. Consequently, the bias-voltage value of the capacitor C1 becomes 2.0×1.5=3.0V, and thus, exceeds the rated voltage 2.6 V of the capacitor C1.

Figure 3:
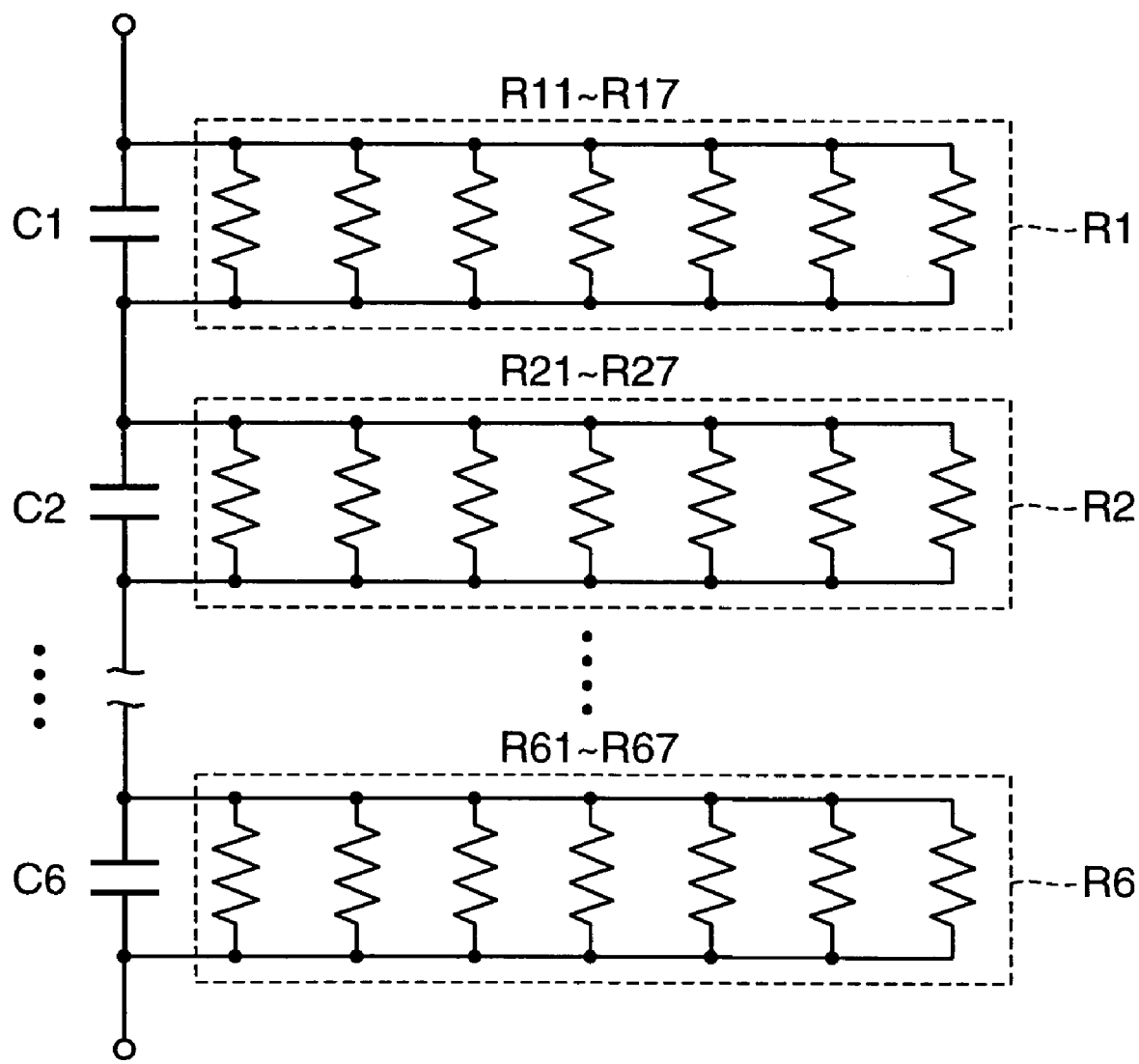
FIG. 3 is a circuit diagram of a capacitor device in which the number of resistors which make up a balance resistor portion is seven, compared with the capacitor device of FIG. 2.

FIG. 3 is a circuit diagram of a capacitor device in which the number of resistors which make up a balance resistor portion R1 is seven, compared with the capacitor device of FIG. 2. In the capacitor device shown in FIG. 3, if a resistor R11 is broken, the resistance of a balance resistor portion R1 turns into r/6. Hence, it becomes (r/6)/(r/7)=7/6 times as great as that before it is broken, and thus, the increase in the bias voltage is less than that of the capacitor device shown in FIG. 2. From the point of view of restraining a broken resistor from going up the bias voltage, it is preferable that the number of resistors which make up the balance resistor portion Ri be increased.

However, such an increase in the number of resistors makes their power loss heavier. As a result, an electric charge may be discharged immediately after the charge has been given. Hence, preferably, the number of resistors which make up the balance resistor portion Ri should be four to six. It is more desirable that it be five. In other words, it is preferable that the resistance of the balance resistor portion Ri be equal to, or more than, one-sixth the resistance of each resistor which makes up the balance resistor portion Ri and be equal to, or less than, one-fourth this resistance. It should be one-fifth, more desirably.

As described so far, in the capacitor device according to the first embodiment, the balance resistor portions R1 to Rn are each formed by the plurality of resistors Ri1 to Ri5 connected in parallel. Therefore, the resistance of each balance resistor portion R1 to Rn can be kept from dispersing, thus helping charge the capacitors C1 to Cn uniformly.

In addition, the balance resistor portion R1 is formed by the plurality of resistors connected in parallel. Therefore, even if any resistors are damaged and opened, then because there are the remaining resistors connected in parallel, the bias voltage can be restrained from being higher. This helps not only charge each capacitor C1 to Cn in balance, but also prevent the capacitors from being destroyed.

Incidentally, in view of a reduction in the loss at the time of a charge and a discharge in the capacitors C1 to Cn, preferably, the resistance of the balance resistor portion should be within a range of 10 to 500Ω.

Second Embodiment

Figure 4:
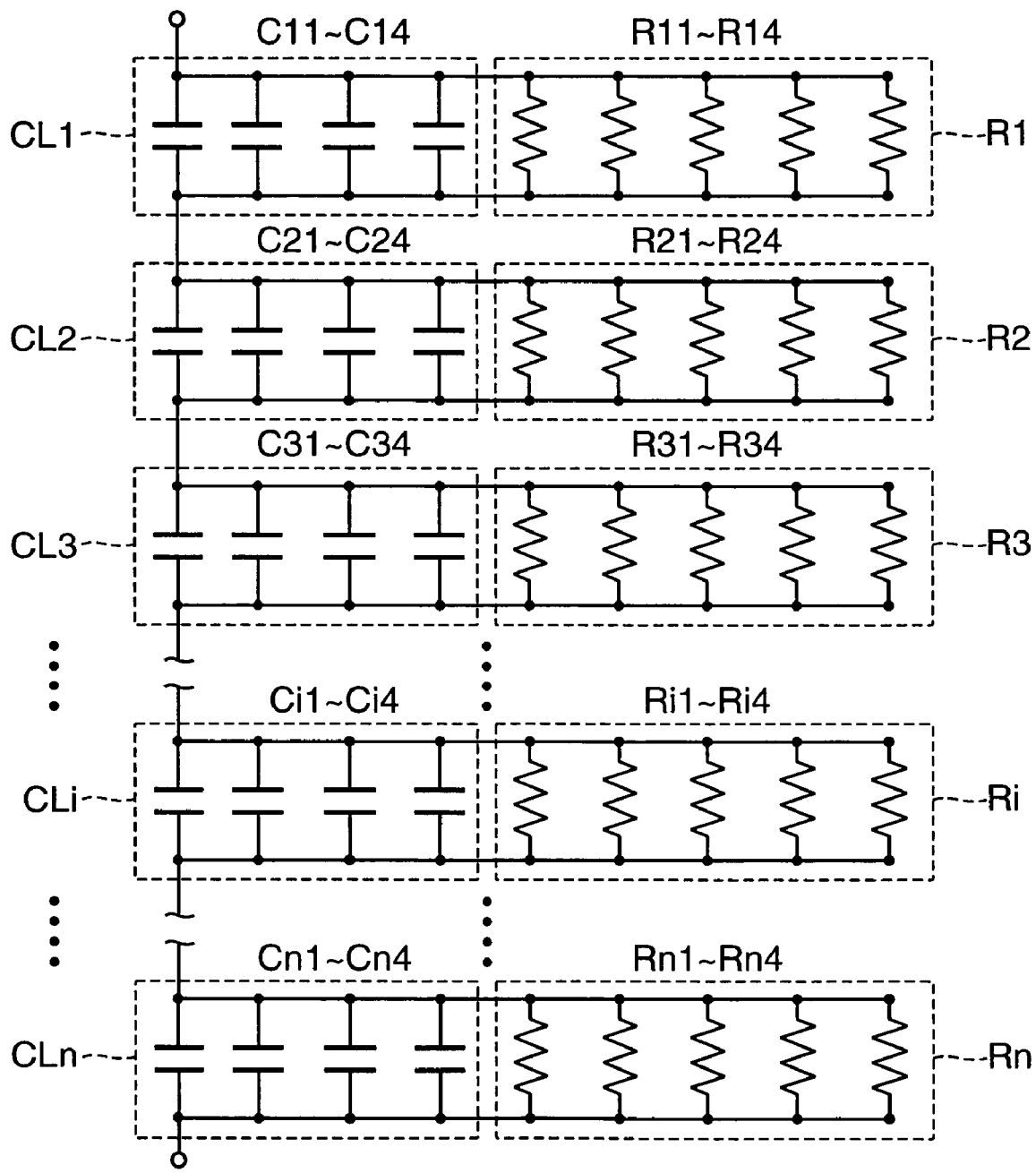
FIG. 4 is a circuit diagram of a capacitor device according to a second embodiment of the present invention.

FIG. 4 is a circuit diagram of a capacitor device according to a second embodiment of the present invention. In the capacitor device according to the second embodiment, capacitors are connected in parallel, as contrasted with the capacitor device according to the first embodiment. Specifically, the capacitor device shown in FIG. 4 includes n cell groups CL1 to CLn connected in series, and n balance resistor portions R1 to Rn connected in parallel to each cell group CL1 to CLn. To the i-th (i=1, 2, 3, ... n) cell group CLi, four capacitors Ci1 to Ci4 are connected in parallel. The balance resistor portions R1 to Rn has the same configuration as those of the capacitor device according to the first embodiment shown in FIG. 1. Thus, their description is omitted.

In this way, even if the capacitors are connected in parallel so that the capacitor device's capacitance increases, the resistance of each balance resistor portion R1 to Rn can be restrained from dispersing. This is because the balance resistor portions R1 to Rn are connected in parallel to the cell groups CL1 to CLn. Consequently, the capacitors Ci1 to Ci4 can be uniformly charged.

Furthermore, even if any of resistors Ri1 to Ri5 which make up the balance resistor portion Ri is damaged and opened, then because the remaining resistors connected in parallel are provided, the bias voltage to the cell group CLi can be restrained from being higher. This helps give the bias voltage in balance to each cell group CL1 to CLn, thus preventing the capacitors C11 to Cn5 from being damaged.

Moreover, four electric double-layer capacitors are connected in parallel, so that the capacitance can be heightened. Hence, this capacitor device can be used, for example, as each control power source or auxiliary power source for an electric automobile or the like which requires a large capacitance and a great quantity of current. Incidentally, in FIG. 4, the number of capacitors which make up the cell group CLi is four. However, it is not limited to this, and thus, two, three, five or more may also be provided.

Figure 5:
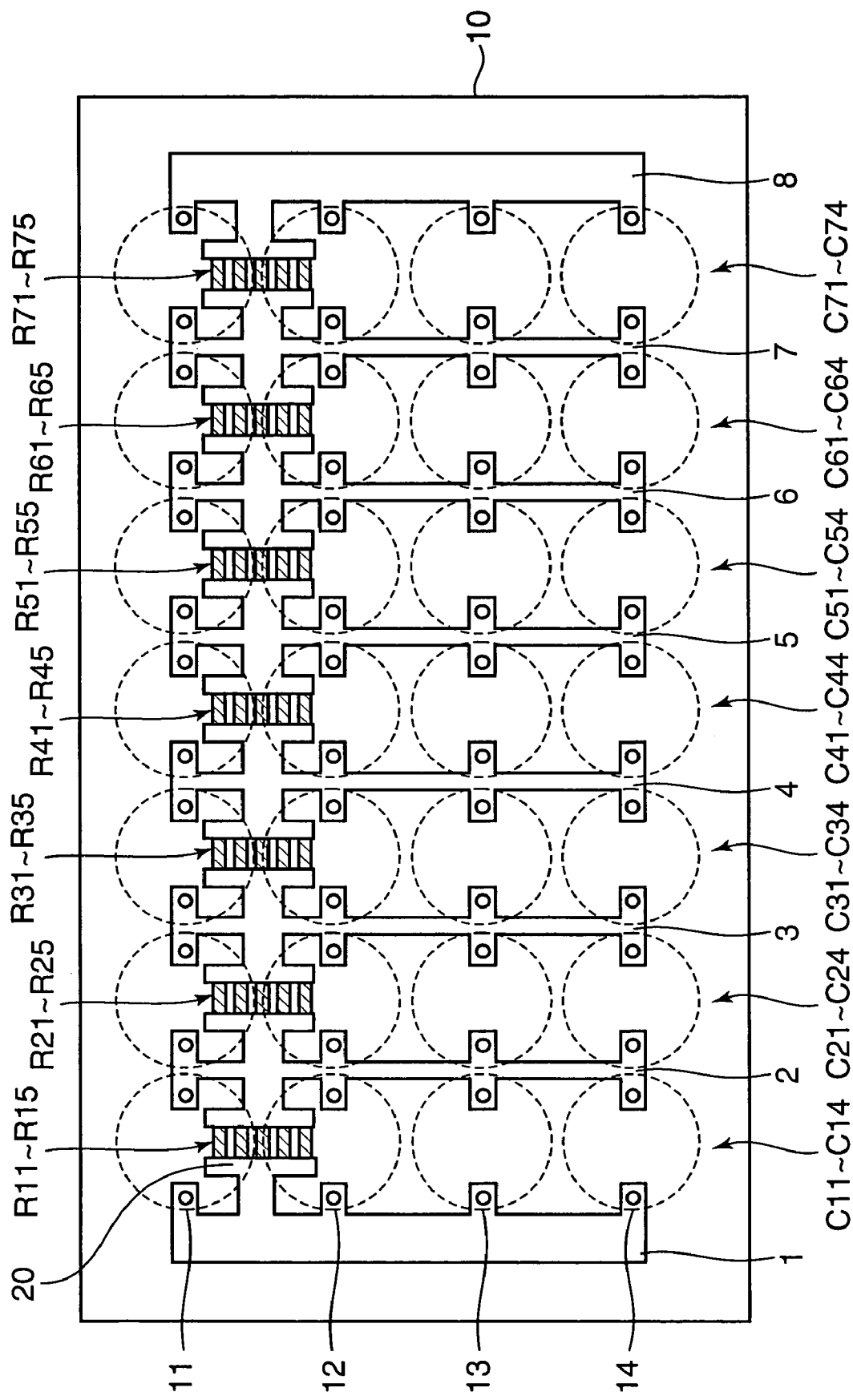
FIG. 5 is an illustration of the structure of the capacitor device shown in FIG. 4, showing the case where the number of cell groups CL1 to CLn is seven.
Figure 6:
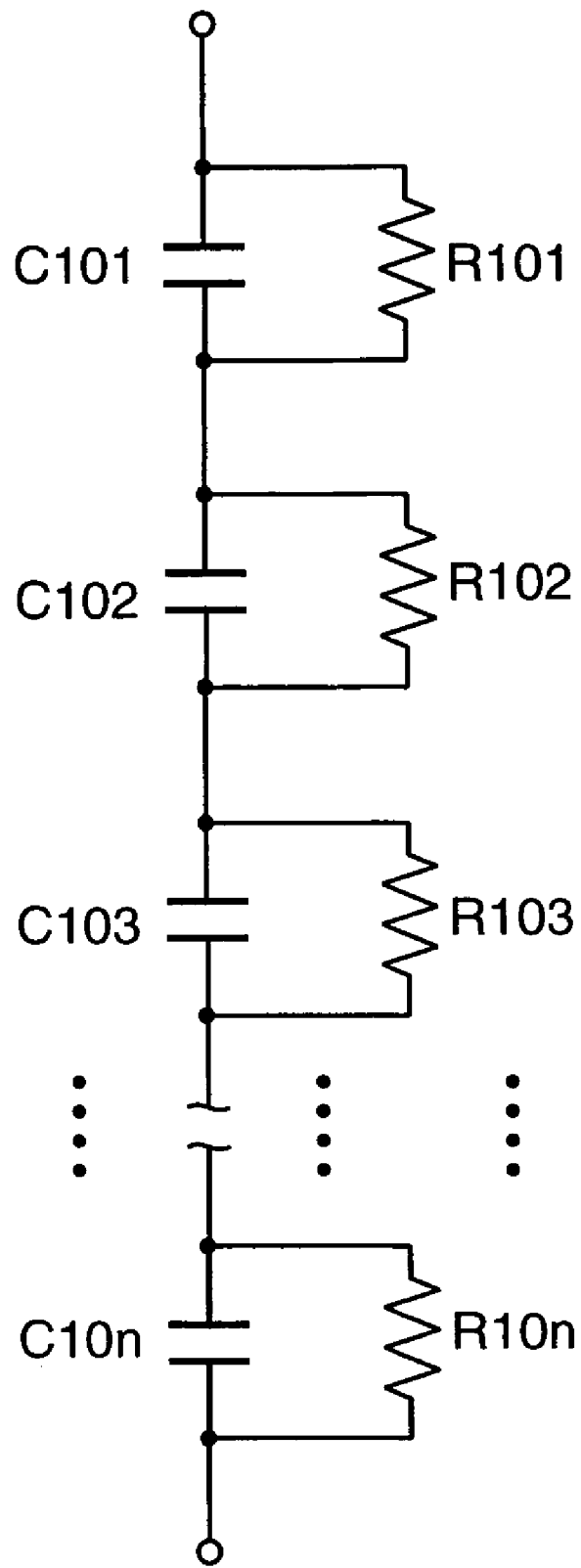
FIG. 6 is a circuit diagram of a capacitor device according to a prior art.

Next, the structure of the capacitor device will be described. FIG. 5 is an illustration of the structure of the capacitor device shown in FIG. 4, showing the case where the number of the cell groups CL1 to CLn is seven. As shown in FIG. 5, this capacitor device includes a circuit board 10 on which eight wiring patterns 1 to 8 are printed, twenty-eight capacitors C11 to C74 which are disposed in a matrix form of four lines and seven rows, and thirty-five resistors R11 to R75.

The Next, the wiring patterns 1 to 8 are formed by a conductor made of copper, silver or the like. They have a long and narrow shape and are formed at fixed intervals on the circuit board 10 so that their longitudinal directions are parallel. Herein, the distance between each wiring pattern 1 to 8 is approximately equal to the pitch at which the capacitors C11 to C74 are disposed.

In each wiring pattern 1 and 8, four convex portions 11 to 14 are formed at regular intervals along the longitudinal directions. Besides, in each wiring pattern 2 to 7, four convex portions 11 to 14 are formed at regular intervals along one side in the longitudinal directions. Along the other side in the longitudinal directions, four convex portions 11 to 14 are formed at regular intervals. Herein, the interval of each convex portion 11 to 14 is substantially equal to the disposition pitch of each capacitor C11 to C74. In each convex portion 11 to 14, a through hole is formed into which the lead wire of each capacitor is inserted. A conductor is formed on the inner wall of the through hole.

Between the convex portions 11 and 12, a T-shaped terminal 20 for connecting five resistors is formed so as to protrude in the directions perpendicular to the longitudinal directions of the wiring patterns 1 to 8. In the wiring patterns 1 to 8, the convex portions 11 to 14 and the terminals 20 are formed so as to face each other.

Between the terminal 20 of the wiring pattern 1 and 12 and the terminal 20 of the wiring pattern 2, five resistors R11 to R15 are connected. In the same way, between the other adjacent wiring patterns, five resistors are also connected via the terminal 20. Thereby, the resistors R11 to R15 are connected in parallel. Similarly, the other resistors are also connected in parallel.

Between the wiring patterns 1 and 2, the capacitors C11 to C14 are connected from the opposite surface (or back surface) to the surface of the circuit board 10 onto which the resistors are connected. Between the wiring patterns 2 and 3, the capacitors C21 to C24 are connected; ... ; and between the wiring patterns 7 and 8, the capacitors C71 to C74 are connected. Specifically, in the capacitor Cij (herein, i is an integer of one to seven, and i is an integer of one to four), one lead wire is inserted into the through hole of the convex portion 11 of the j-th wiring pattern j. Then, they are soldered together. The other lead wire is inserted into the through hole of the convex portion 11 of the wiring pattern j+1. Then, they are soldered up.

Thereby, the capacitors C11 to C14 are connected in parallel. The other capacitors are connected in parallel as well.

As described above, the wiring patterns 1 to 8 are disposed in parallel so that their longitudinal directions are parallel. Then, several capacitors are connected in parallel between adjacent wiring patterns. Between two capacitors connected in parallel, the terminal 20 is formed. Then, five resistors are connected to this terminal 20. Between adjacent wiring patterns, four capacitors are connected from the back surface. Therefore, the full length of a wiring pattern can be shortened. This helps lower the wiring resistance, enhance the charge efficiency of the capacitors C11 to C74, and make the circuit board 10 smaller.

Incidentally, in FIG. 5, the terminal 20 is formed between the convex portions 11 and 12. However, its formation is not limited to this, and thus, it may also be formed between other convex portions. In addition, the wiring patterns 1 to 8 are printed on the circuit board 10, but their configuration is not limited to this. A flat-plate member formed by a conductive member may also be used.

INDUSTRIAL APPLICABILITY

According to the present invention, a capacitor device can be provided which is capable of charging each electric double-layer capacitor in balance and preventing the electric double-layer capacitors from being damaged.

The invention claimed is:
1. A capacitor device, comprising:
a plurality of electric double-layer capacitors connected in series; and
a plurality of balance resistor portions each comprising m resistors connected in parallel with each other and having equivalent resistance to each other, m being an integer greater than or equal to two;
the plural balance resistor portions being connected in parallel to the plural electric double-layer capacitors, respectively.
2. The capacitor device according to claim 1, wherein the resistance of at least one of the balance resistor portions is equal to, or less than, one-fourth the resistance of each resistor of said at least one of the balance resistor portions.

3. The capacitor device according to claim 1, wherein the resistance of at least one of the balance resistor portions is equal to, or more than, one-sixth the resistance of each resistor of said at least one of the balance resistor portions.

4. The capacitor device according to claim 1, wherein the resistance of at least one of the balance resistor portions is equal to, or more than, one-sixth the resistance of each resistor of said at least one of the balance resistor portions and is equal to, or less than, one-fourth the resistance of each resistor of the at least one of the balance resistor portions.

5. The capacitor device according to claim 1, wherein the resistance of at least one of the balance resistor portions is greater than or equal to 100Ω or above and less than or equal to 500Ω.

6. The capacitor device according to claim 1, wherein the number of electric double-layer capacitors connected in series is set so that a bias voltage given to each electric double-layer capacitor is lower than the rated voltage of the electric double-layer capacitor.

7. The capacitor device according to claim 1, wherein one or a plurality of electric double-layer capacitors are further connected in parallel to at least one of the balance resistor portions.

8. A wiring pattern comprising:
three or more wiring patterns disposed at a predetermined interval;
a plurality of electric double-layer capacitors connected in parallel between adjacent wiring patterns; and
between two adjacent electric double-layer capacitors which are connected between the wiring patterns, a plurality of resistors, having an equivalent resistance, connected in parallel to the electric double-layer capacitors.

9. The wiring pattern according to claim 8, wherein the resistors are connected from one wiring surface of the wiring pattern, and the electric double-layer capacitors are connected from another wiring surface of the wiring pattern.

* * * * *